United States Patent [19]

Honda

[11] Patent Number: 5,105,335
[45] Date of Patent: Apr. 14, 1992

[54] HARD CASE FOR HOUSING AND CARRYING ELECTRONIC DEVICES

[75] Inventor: Masami Honda, Tokyo, Japan

[73] Assignee: Kabushiki Kaisha Toshiba, Kawasaki, Japan

[21] Appl. No.: 586,383

[22] Filed: Sep. 21, 1990

Related U.S. Application Data

[63] Continuation of Ser. No. 343,210, Apr. 26, 1989, abandoned.

[30] Foreign Application Priority Data

Apr. 28, 1988 [JP] Japan .............................. 63-57838[U]

[51] Int. Cl.$^5$ .............................................. H02B 1/00
[52] U.S. Cl. ...................... 361/380; 16/126; 220/94 R; 294/142; 361/392; 361/394; 361/417
[58] Field of Search ...................... 16/110 R, 125, 126; 220/94 R, 94 A, 94 B; 294/142, 169; 361/380, 392, 393, 394, 395, 399, 417, 419–420

[56] References Cited

U.S. PATENT DOCUMENTS

| | | |
|---|---|---|
| 4,089,464 | 5/1978 | Teti, Jr. et al. ...................... 294/142 |
| 4,196,821 | 4/1980 | Teti, Jr. et al. ...................... 16/126 |
| 4,515,419 | 5/1985 | Hampel et al. ...................... 220/94 R |

FOREIGN PATENT DOCUMENTS

| | | |
|---|---|---|
| 305917 | 5/1955 | Switzerland . |
| 0291564 | 6/1928 | United Kingdom .............. 220/94 R |
| 1227034 | 3/1971 | United Kingdom . |

OTHER PUBLICATIONS

Presentation Device for Overhead Projector, 07/342,782, M. Honda, filed Apr. 25, 1989.
Presentation Device used in combination with an Overhead Projector, 07/342,778, M. Honda, filed Apr. 25, 1989.

*Primary Examiner*—Gregory D. Thompson
*Attorney, Agent, or Firm*—Finnegan, Henderson, Farabow, Garrett, and Dunner

[57] ABSTRACT

A hard case including a casing with an opening through which an electronic device is housed. The casing has a U-shaped carrying handle which is provided with a pair of projections arranged adjacent to the opening on lateral sides of the casing. Each of the projections is oblate shaped and arranged on the casing with its long axis directed along the lateral side of the casing. Proximal ends of paired arms of the carrying handle are provided with engaging holes. Each of the engaging holes has a circular hole portion made flexible at the inner rim thereof and provided with a diameter a little shorter than the length of the projection when viewed along the long axis of the projection, but longer than the width of the projection when viewed along the short axis of the projection. Each of the engaging holes also has a slot extending continuous from the inner rim of the circular hole portion toward a grip of the carrying handle and having a width larger than the width of the projection, when viewed along the short axis of the projection, so as to allow the projection to be positioned in the circular hole portion with its long axis directed in the longitudinal direction of the arm.

16 Claims, 3 Drawing Sheets

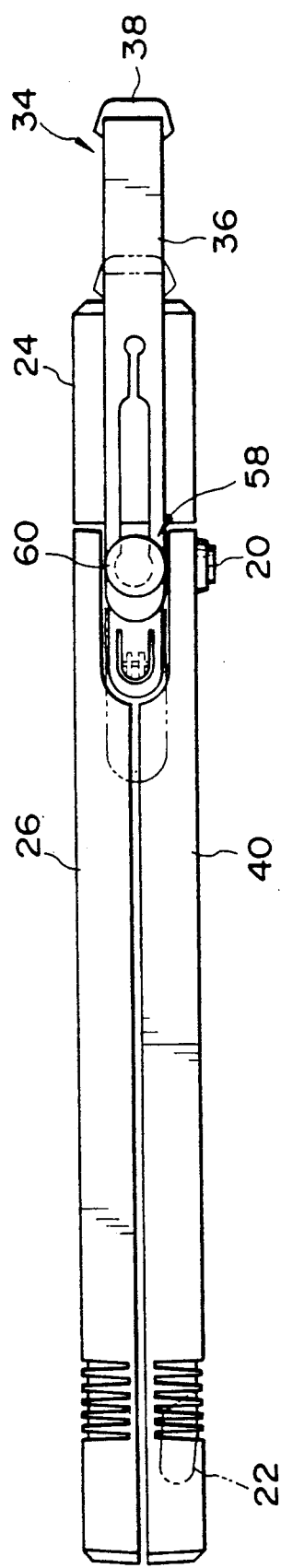
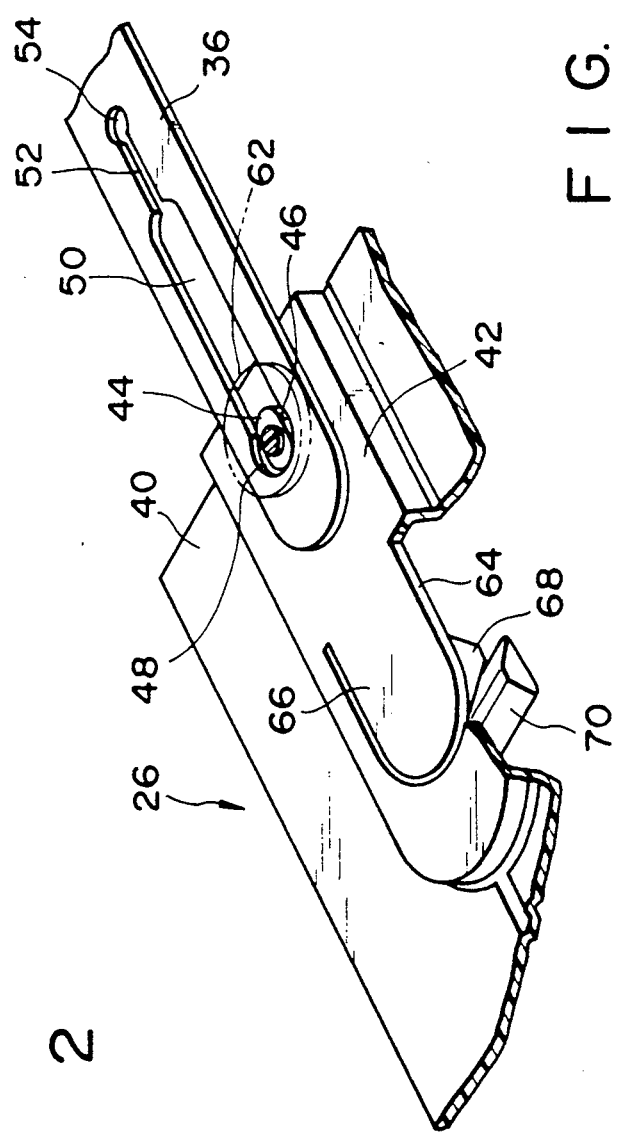
FIG. 2
FIG. 3

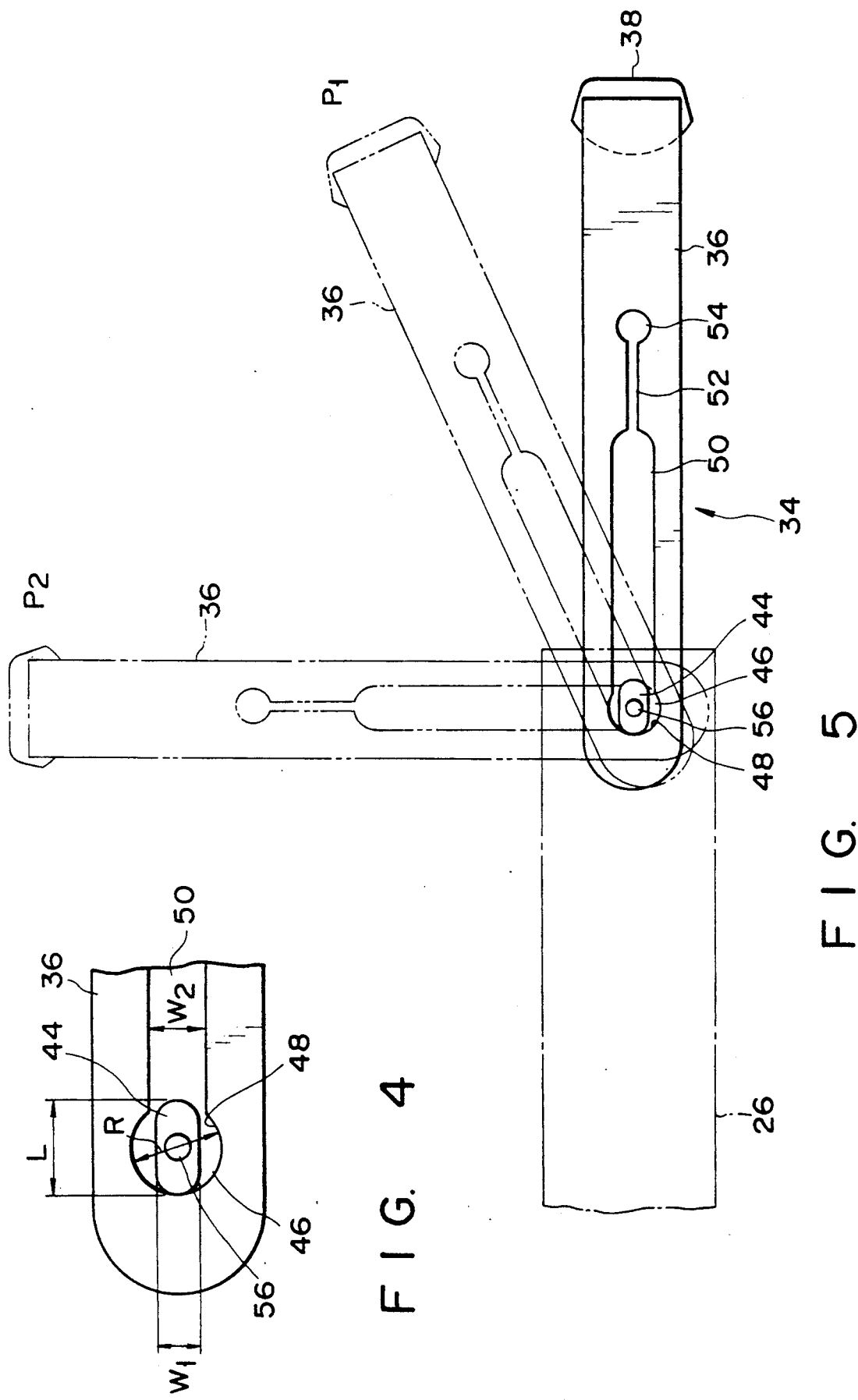

HARD CASE FOR HOUSING AND CARRYING ELECTRONIC DEVICES

This application is a continuation of application Ser. No. 07/343,210, filed Apr. 26, 1989, now abandoned.

BACKGROUND OF THE INVENTION

1. Field of the Invention

The present invention relates to a hard case for electronic devices and more particularly, it relates to a hard case provided with a carrying handle.

2. Description of the Related Art

When left unused, an electronic device or unit provided with a display section, such as a liquid crystal panel unit, is usually housed and stored in a hard case or carried in the hard case to protect its display section.

The hard case of this type is made of synthetic resin and shaped like a box having an opening at its one end face through which the electronic device is inserted and housed.

The hard case includes a carrying handle which enables the electronic device in the hard case to be easily carried. The carrying handle is usually U-shaped and freely, swingably attached to both sides of the hard case and is adjacent to the opening of the case. More specifically, the carrying handle has a pair of arms parallel to each other, whose proximal ends are freely, swingably attached to both opposite sides of the hard case, and whose distal ends are connected to each other by a cross bar which serves as the handle grip.

According to the above-described hard case, the electronic device can be inserted into the hard case through the opening and stored as is when left unused. When the electronic device is housed in the hard case and the carrying handle of the case is gripped by hand, it can be carried together with the case.

The simplest and easiest manner of removing the electronic device from the box-shaped hard case is to direct the opening of the hard case downward and to pull the electronic device out of the case by hand. However, the carrying handle is freely, swingably attached to the hard case, when the opening of the case is directed, to pull the electronic device out of the case, the carrying handle hangs from the case due to its own weight and strikes against the hand of a person by which the electronic device is gripped. The carrying handle thus disturbs the pulling of the electronic device out of the case by hand. It is also apparent that the carrying handle becomes a hindrance at the time when the electronic device is inserted into the hard case, while keeping the opening of the case directed downward. Further, the carrying handle may be unexpectedly swung relative to the hard case.

SUMMARY OF THE INVENTION

The object of the present invention is to provide a hard case for electronic devices wherein the electronic device can be smoothly pulled out of and inserted into the hard case leaving the carrying handle neither unexpectedly swung relative to the case nor troublesome.

This object can be achieved by a hard case for housing and carrying the electronic device, the hard case comprising a hard casing having a space in the casing into which the electronic device is housed. An opening provided at one side of the casing faces toward the outside of the casing and enables the electronic device to be inserted into the space in the casing. A pair of lateral sides extending, parallel to each other, from the opening; define the spacing in the casing together with the remaining sides. A handle means is arranged on the casing and includes a pair of projections arranged at those portions on the lateral sides of the casing which are adjacent to the opening. Each of the projections have a long axis extending in the longitudinal direction of the lateral side of the casing and a short axis extending perpendicular to the longitudinal direction of the lateral side. The projections are made circular at both ends when viewed along the long axis thereof. The U-shaped carrying handle is made of synthetic resin and has a pair of arms extending parallel to each other. A grip for connecting the arms together is grasped by hand when the hard case in which the electronic device has been housed is to be carried. Engaging holes are formed at the free ends of the arms and with which the projections are engaged. Each of the engaging holes include a circular hole portion having a diameter a little shorter than the length of the projection when viewed along the long axis thereof, but longer than the width of the projection when viewed along the short axis thereof. Each of the circular hole portions being flexible along their inner rim. Each of the engaging holes also include a cutout formed by cutting away a portion of the inner rim of from the circular hole portion located at the grip side, to allow the projection to be positioned in the circular hole portion. The cutout has a width longer than that of the projection when viewed along the short axis thereof.

According to the above-described hard case, when the carrying handle is gripped by hand to hang the hard case, the paired projections on both sides of the casing are engaged with the engaging holes in such a way that the lower circular end of each of the projections is contacted with the inner rim of circular hole portion, while the upper circular end thereof is positioned in the cutout. When the hard case is left hanging from the carrying handle, therefore, the carrying handle can be freely swung relative to the casing until the upper circular end of each of the projections comes to strike against the inner rim of its corresponding circular hole portion. When the carrying handle is further swung relative to the casing, both circular ends of each of the projections on both sides of the casing are fitted into the circular hole portion, forcibly deforming the inner rim of the circular hole portion. When the inner rim of each of the circular hole portions is elastically deformed like this, the elastic deformation generates a relatively large frictional force which resists the swinging of the carrying handle. When both circular ends of each of the projections are fitted in the circular hole portion, pressing against the inner rim of this hole portion, the carrying handle can be held at any optional angle relative to the casing.

When the above-described hard case is used, therefore, the carrying handle can be held at a position that is remote from the opening of the casing. This enables the electronic device to be easily inserted into and pulled out of the casing through the opening thereof, leaving the carrying handle out of the way. Further, the carrying handle can be held at a certain position relative to the casing and this prevents the carrying handle from being unexpectedly swung to collide against any matter around the case.

Furthermore, the carrying handle can be freely swung relative to the casing in a certain range while the electronic device in the hard case is being carried. This makes the carrying of the electronic device easy and comfortable.

According to a preferred embodiment of the present invention, the cutout of each of the engaging holes formed at the arms extends toward the grip of the carrying handle and along the arm by a certain length, keeping its width certain, to serve as a guide slot. When this guide slot is formed at each of the arms of the carrying handle, its corresponding projection can be introduced into it. When the axis of the guide slot and the long axis of the projection are directed in the same direction, the projection can be introduced into the guide slot and when the projections are positioned in their corresponding guide slots, the carrying handle can be slid along both sides of the casing. In other words, the carrying handle can be made short or long relative to the casing.

According to the preferred embodiment of the present invention, a slit having a width smaller than that of the guide slot extends from the end rim of each of the guide slots, which is located opposite to the circular hole portion, toward the grip of the carrying handle. This slit enables both inner rims of each of the guide slots, which extend along the longitudinal direction of each of the arms, to be elastically deformed to some extent. Even if the carrying handle should be mistakenly swung, leaving the projections held in their corresponding guide slots, the slits allow the guide slots to be elastically deformed at their long inner rims, thereby preventing these inner rims of the guide slots from being damaged by the projections.

BRIEF DESCRIPTION OF THE DRAWINGS

FIG. 2 is a side view showing the hard case in which the electronic device has been housed;

FIG. 3 is an enlarged perspective view showing how a carrying handle is connected to a casing of the hard case;

FIG. 4 is an enlarged side view showing the base portion of an arm of the carrying handle; and FIG. 5 is intended to explain the function of the carrying handle.

DETAILED DESCRIPTION OF THE PREFERRED EMBODIMENTS

Figure 1:
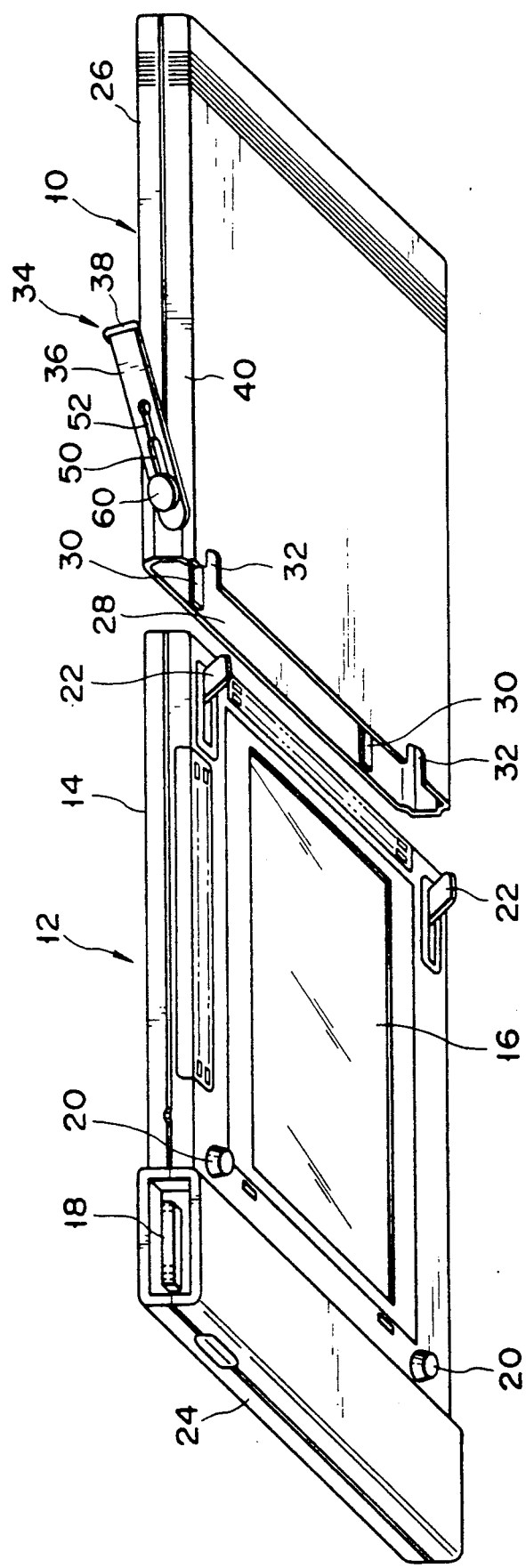
FIG. 1 is a perspective view showing an example of the hard case according to the present invention together with an electronic device.

Hard case 10 shown in FIG. 1 is intended to house and carry electronic device or display device 12. Display device 12 is used together with an overhead projector (not shown) and it has panel unit 14 shaped like a rectangle. Liquid crystal panel 16 of the transmission type is arranged in panel unit 14. Liquid crystal panel 16 is connected to a portable personal computer, for example, via connector 18 in panel unit 14 and panel 16 can receive image signals from the personal computer to display images formed on the basis of the image signals received. Connector 18 is a part of a circuit unit which is formed integral to panel unit 14.

When the above-described display device 12 is set on the stage of the overhead projector, therefore, images displayed on liquid crystal panel 16 can be projected on the screen.

Four legs are arranged on the underside of display device 12 at four corners thereof. Two of the legs which are located on the side of connector 18 serve as fixed legs 20, while the remaining two serve as swingable legs 22. These swingable legs 22 are urged by springs (not shown) to project from panel unit 14, as shown in FIG. 1, but when display device 12 or panel unit 14 is to be inserted and housed in hard case 10, the swingable legs 22 are swung and forced into unit panel 14 by hard case 10 itself.

Hard case 10 has casing 26 made of synthetic resin and this casing 26 has a rectangular shape a little larger in size than panel unit 14 of display device 12 because casing 26 must house panel unit 14 therein. Casing 26 has also rectangular opening 28 at one of its short sides into which panel unit 14 is inserted. As shown in FIG. 1, a pair of guide tapes 30 are bonded to each of the inner walls of casing 26 which correspond to upper and lower faces of panel unit 14. These guide tapes 30 serve to guide panel unit 14 when panel unit 14 is being inserted into casing 26 through opening 28 of casing 26. Further, the lower rim of opening 28 of casing 26 is provided with a pair of cutaway portions 32. Fixed legs 20 are received into these cut-away portions 32 when panel unit 14 is housed in casing 26. This prevents fixed legs 20 of panel unit 14 from becoming obstacles when panel unit 14 is housed in casing 26.

Hard case 10 has carrying handle 34, which is made of synthetic resin and shaped like the letter "U". Carrying handle 34 has a pair of arms 36 extending parallel to each other and a grip 38 for connecting arms 36 at one end thereof.

The other ends or proximal ends of the paired arms 36 of carrying handle 34 are freely, swingably attached to sides 40 of casing 26, which are adjacent to opening 28. Sides 40 extend parallel to each other from opening 28, as shown in FIG. 1.

FIG. 3 shows in detail how the proximal end of one arm 36 is connected to casing 26. As apparent from FIG. 3, portion 42 is embossed, adjacent to opening 28, on side 40 of casing 26. This embossed portion 42 extends from opening 28 in the longitudinal direction of side 40 and is shaped like a semicircle at one end thereof. Projection 44 is located, adjacent to opening, 28 on embossed portion 42. This projection 44 has an oblate shape having long and short axes, and it is arranged with its long axis directed in the longitudinal direction of side 40. Projection 44 may be shaped like an oval, for example, instead of its having the oblate shape.

The proximal end of arm 36 is provided with engaging hole 46 into which projection 44 is loosely fitted. As shown in FIG. 4, engaging hole 46 is provided with circular hole portion 48 having diameter R a little shorter than length L of projection 44 when viewed along the long axis of projection 44, but longer than width $W_1$ of projection 44 when viewed along the short axis thereof. Arm 36 is provided with guide slot 50 continuous from the inner rim of circular hole portion 48 and extending by a certain distance in the longitudinal direction of arm 36. Width $W_2$ of guide slot 50 is a little larger than width $W_1$ of projection 44 but smaller than diameter R of circular hole portion 48.

As shown in FIG. 3, arm 36 is further provided with slit 52 continuous from guide slot 50. Slit 52 extends from one end of guide slot 50, which is opposite to circular hole portion 48, along arm 36 by a certain distance and is provided with another circular hole portion 54 at the front end thereof.

It should be noted that arm 36 has a thickness to allow the inner rim of circular hole portion 48 to be elastically deformed due to guide slot 50 and both long side rims of guide slot 50 to be elastically deformed due to slit 52.

The inner rims of guide slot 50 which are continuous with slit 52, are shaped like a semicircle.

As shown in FIG. 4, screw hole 56 is formed in projection 44 in the same direction as the axis of circular hole portion 48 and setscrew 58 is screwed into screw hole 56. Head 60 of setscrew 58 is shaped like a disc having a diameter larger than the diameter R of circular hole portion 48 and substantially equal to the width of arm 36. Arm 36 of carrying handle 34 can thus be prevented from coming out of projection 44 by means of setscrew 58 attached to projection 44.

As shown in FIG. 3, U-shaped slit 62 is formed at the circular end of embossed portion 42, to form an elastically deformable tongue 66 extending in a direction opposite to projection 44 on embossed portion 42. Engaging claw 68 projects from the inner face of tongue 66. This claw 68 can be engaged with a ridge portion 70 on the side of panel unit 14 when panel unit 14 is housed in casing 26. Each of ridge portions 70 on both sides of panel unit 14 are made triangular and when panel unit 14 is to be housed in casing 26, these ridge portions 70 slide over engaging claws 68 on the inner faces of tongues 66, elastically deforming tongues 66, and engaging with the back sides of engaging claws 68. When panel unit 14 in casing 26 is to be pulled out of casing 26, panel unit 14 is pulled with a certain force to release engaging claws 68 on the inner faces of tongues 66 from ridge portions 70 on both sides of panel unit 14, elastically deforming tongues 66. Panel unit 14 can thus be pulled out of casing 26.

When carrying handle 34 is positioned as shown by solid lines in FIG. 5, it can be freely swung in a certain range. More specifically, carrying handle 34 can be freely swung to position $P_1$ shown by the two-dot and dash line in FIG. 5, where one circular end of projection 44 strikes against the border of the inner rim of circular hole portion 48 of engaging hole 46 with one long inner side rim of guide slot 50. In other words, handle 34 can be freely swung until one circular end of projection 44 strikes against the border of circular hole portion 48 with guide slot 50.

Further, the inner rim of circular hole portion 48 can be elastically deformed. Therefore, carrying handle 34 can be swung to position $P_2$ similarly shown by two-dot and dash lines in FIG. 5, passing over the certain range, and then until carrying handle 34 strikes against casing 26, passing over position $P_2$, while the inner rim of circular hole portion 48 is elastically deformed by both circular ends of projection 44. When the inner rim of circular hole portion 48 of engaging hole 46 is elastically deformed by both circular ends of projection 44, this allows carrying handle 34 to generate a certain resistance against the inner rim of circular hole portion 48. When carrying handle 34 is swung, passing over its freely swinging range, it can be held there unless force which overcomes its resistance is applied from the outside.

The carrying handle 34 can thus be held at any position where it passes over its freely swinging range. When it is held at position $P_2$, for example, it can be prevented from unexpectedly swinging around projections 44 and disturbing the process of inserting panel unit 14 into casing 26 or pulling it out of casing 26.

When carrying handle 34 is positioned as shown by solid lines in FIG. 5, it can be pushed relative to casing 26 by the length of guide slot 50, introducing projections 44 into guide slots 50. When handle 34 is pushed like this, it can be then pulled to the position shown by solid lines in FIG. 5.

Each of arms 36 of carrying handle 34 are provided with slit 52 continuous from guide slot 50. Even when carrying handle 34 is swung with projections 44 located in guide slots 50, stress can be prevented from concentrating onto the borders of guide slots 50 with slits 52 because both long inner sides of each of guide slots 50 can be deformed to some extent due to slit 52. This prevents arms 36 from being damaged. In addition, each of the slits 52 has circular hole 54 at the free end thereof and this also prevents slits 52 from being damaged at both long sides thereof.

What is claimed is:

1. A case for housing and carrying an apparatus comprising:

handle means attached to the case for carrying the apparatus, said handle means including a pair of arms, each of said arms including a proximal end and an opposed end, and a grip connecting said arms at said opposed ends;

projection means mounted on opposed sides of said casing;

guide means in said proximal ends of each of said arms for slidably receiving and engaging said projection means, wherein said arms are rotated between a first position for storing said handle means and a second position for operating said handle means to carry the apparatus; and slit means disposed in each of said arms for allowing said guide means to be elastically deformed when said arms are rotated to said second position.

2. The case according to claim 1, wherein each of said guide means includes an elastic portion for supplying a friction force to said projection means for locking said arms at an arbitrary angle with the casing when said arms are rotated to said second position.

3. A case having opposed sides, for housing and carrying an apparatus, the case comprising:

a handle, the handle including a pair of elastic arms and a grip connecting said arms, each of said arms having a slot, and each of said slots including a first end, a second end, and a surrounding wall defining a circular hole; and a projection mounted on each of said opposed sides of the case, each of said projections being slidably engaged in said slot in each of said arms for selectively moving said handle between a stored position and an operating/rotating position, wherein each of said projections is disposed in said circular hole of each of said slots and contacts said surrounding wall of said circular holes, respectively, for rotating and locking each of said arms at an arbitrary angle with the casing when said handle is moved to said operating/rotating position.

4. The case according to claim 3, wherein each of said projections comprises a long portion having a length slightly longer than a diameter of each of said circular holes and wherein each of said long portions pushes said surrounding wall of each of said circular holes outwardly when said handle is moved to said operating/rotating position.

5. The case according to claim 3, wherein each of said arms further comprises a slit connected to said first end of each of said slots for allowing each of said slots to be elastically deformed when said handle is moved to said operating/rotating position.

6. A case having opposed ends, for housing and carrying an apparatus, the case comprising:
   a handle, the handle including a pair of elastic arms and a grip connecting said arms, each of said arms having a slot of a first width, each of said slots including a first end, a second end, and a surrounding wall defining a circular hole having a diameter greater than the first width, each of said circular holes being connected to each of the second ends, respectively;
   a projection mounted on each of said opposed sides of said case, each of said projections including a long portion having a second width slightly larger than the diameter of said respective circular holes and a short portion having a third width slightly smaller than said first width of said respective slots, wherein each of said projections is slidably disposed, respectively, in each of said slots for moving said handle between a storing position and an operating/rotating position, and each of said projections is disposed in each of said circular holes to allow said handle to rotate; and
   wherein when said handle is moved to said operating/rotating position, said long portion of each of said projections pushes the surrounding wall of each of said circular holes, the arms are flexed by said respective projections and said handle is locked at an arbitrary angle with said case.

7. The case according to claim 6, wherein each of said arms further includes a slit, each of said slits being connected to said second end of each of said slots, respectively, for allowing said respective slots to be elastically deformed when said arms are flexed.

8. A hard carrying case for housing and carrying an electronic device comprising:
   a body having an inlet opening to receive the electronic device, said body including at least one pair of parallel side walls extending in a longitudinal direction from said inlet opening;
   a projection arranged on each of the side walls of the body in a vicinity of said inlet opening, each of said projections having a longitudinal length extending along a long axis, each of said long axes being parallel with the longitudinal direction of the side walls, a width extending along a short axis, each of said short axes being perpendicular to the longitudinal direction of the side walls, and arcuate ends on each of said longitudinal lengths;
   a substantially U-shaped carrying handle having a pair of arm portions extending parallel to each other and a grip portion for connecting said arm portions, each of said arm portions including an aperture to receive one of said projections;
   each of said apertures including a circular portion which has a diameter slightly less than the longitudinal length of each of said projections, but greater than the width of each of said projections, and an elongated portion which extends between each of said circular portions and said grip portion along a longitudinal axis of each of said arm portions, wherein each of said elongated portions are slightly wider than each of said projections, such that each of said projections can be located in each of said respective elongated portions; and
   wherein each of said arm portions has an elastic section defining the circular portion of each of said apertures.

9. The hard case according to claim 8, wherein each of said arm portions further comprises a guide slot to guide each of the projections along the longitudinal axis of said arm portions, each of said elongated portions forming a part of each of said guide slots, and each of said elongated portions having a width consistent along its entire length.

10. The hard case according to claim 9, wherein each of the elongated portions has a semicircular end opposed to each of said respective circular portions.

11. The hard case according to claim 10, wherein each of said apertures further comprises a slender portion extending from said respective semicircular ends along the longitudinal axis of each of said arms, each of said slender portions causing each of said arm portions, which defines an elongated portion, to be flexible.

12. The hard case according to claim 11, wherein each of said apertures has an additional circular portion communicating with each of said slender portions, respectively.

13. The hard case according to claim 8, wherein each of said projections includes a stopper member which prevents the respective projections from disengaging with each of said arm portions.

14. The hard case according to claim 13, wherein each of said stopper members comprises a set screw threadably secured and perpendicular to the longitudinal axis of each of said arm portions, each of said set screws having a circular head larger than each of said circular portions of said respective apertures.

15. The hard case according to claim 8, wherein each of said projections has an oblate cross section.

16. The hard case according to claim 8, wherein said handle is made of a synthetic resin.

* * * * *